(12) United States Patent
Martizon, Jr. et al.

(10) Patent No.: US 9,475,694 B2
(45) Date of Patent: Oct. 25, 2016

(54) TWO-AXIS VERTICAL MOUNT PACKAGE ASSEMBLY

(71) Applicant: ANALOG DEVICES GLOBAL, Hamilton (BM)

(72) Inventors: Arturo Martizon, Jr., Metro Manila (PH); Thomas M. Goida, Windham, NH (US)

(73) Assignee: ANALOG DEVICES GLOBAL, Hamilton (BM)

( * ) Notice: Subject to any disclaimer, the term of this patent is extended or adjusted under 35 U.S.C. 154(b) by 833 days.

(21) Appl. No.: 13/741,198

(22) Filed: Jan. 14, 2013

(65) Prior Publication Data

US 2014/0196540 A1    Jul. 17, 2014

(51) Int. Cl.
| | |
|---|---|
| *G01C 19/00* | (2013.01) |
| *B81C 3/00* | (2006.01) |
| *B81B 7/00* | (2006.01) |
| *H01L 23/495* | (2006.01) |

(52) U.S. Cl.
CPC ............. *B81C 3/008* (2013.01); *B81B 7/0074* (2013.01); *H01L 23/49555* (2013.01); *H01L 2224/48091* (2013.01); *H01L 2224/48247* (2013.01); *H01L 2924/1461* (2013.01); *H01L 2924/181* (2013.01); *H01L 2924/1815* (2013.01); *Y10T 29/49117* (2015.01); *Y10T 156/10* (2015.01)

(58) Field of Classification Search
CPC ........... H01L 23/49555; B81B 7/0074; B81B 2201/0242; B81C 3/008
See application file for complete search history.

(56) References Cited

U.S. PATENT DOCUMENTS

| | | |
|---|---|---|
| 3,949,274 A | 4/1976 | Anacker |
| 4,642,670 A * | 2/1987 | Striny ............... H01L 23/49555 257/674 |
| 4,742,183 A | 5/1988 | Soloway et al. |
| 5,126,286 A | 6/1992 | Chance |
| 5,452,182 A | 9/1995 | Eichelberger et al. |
| 5,554,806 A | 9/1996 | Mizuno et al. |

(Continued)

FOREIGN PATENT DOCUMENTS

JP     09121015 A     5/1997

OTHER PUBLICATIONS

Images obtained on Jun. 13, 2011 from a web search related to three-dimensional packaging.

(Continued)

*Primary Examiner* — Harshad R Patel
*Assistant Examiner* — Samir M Shah
(74) *Attorney, Agent, or Firm* — Knobbe, Martens, Olson & Bear, LLP

(57) ABSTRACT

Vertical mount package assemblies and methods for making the same are disclosed. A method for manufacturing a vertical mount package assembly includes providing a base substrate having electrical connections for affixing to external circuitry, and providing a package having a mounting region configured to receive a device therein. Flexible electrical leads are formed between the base substrate and the package. The flexible leads can include a plurality of aligned grooves to guide bending. After forming the flexible electrical leads, the package is rotated relative to the base substrate. The aligned grooves can constrain the relative positions of the substrates during rotation, and the beveled edges of the base substrate and package can maintain a desired angular relationship (e.g., perpendicular) between the base substrate and the package after rotation.

21 Claims, 10 Drawing Sheets

(56) References Cited

U.S. PATENT DOCUMENTS

| | | | | |
|---|---|---|---|---|
| 5,555,159 | A | 9/1996 | Dore | |
| 5,616,863 | A * | 4/1997 | Koen | G01P 1/023 73/431 |
| 5,731,222 | A | 3/1998 | Malloy et al. | |
| 5,889,658 | A * | 3/1999 | Sullivan | G01P 1/023 257/692 |
| 5,903,440 | A | 5/1999 | Blazier et al. | |
| 5,936,850 | A * | 8/1999 | Takahashi | G02F 1/13452 174/117 F |
| 5,949,657 | A * | 9/1999 | Karabatsos | H05K 1/117 174/254 |
| 6,035,712 | A * | 3/2000 | Ohta | G01P 1/023 73/493 |
| 6,040,624 | A | 3/2000 | Chambers et al. | |
| 6,060,780 | A * | 5/2000 | Ohta | G01P 1/023 257/731 |
| 6,075,708 | A | 6/2000 | Nakamura | |
| 6,078,102 | A | 6/2000 | Crane, Jr. et al. | |
| 6,291,894 | B1 | 9/2001 | Farnworth et al. | |
| 6,339,191 | B1 | 1/2002 | Crane, Jr. et al. | |
| 6,348,427 | B1 | 2/2002 | Hamada et al. | |
| 6,511,863 | B2 | 1/2003 | Farnworth et al. | |
| 6,520,789 | B2 * | 2/2003 | Daugherty, Jr. | H01R 12/62 439/329 |
| 6,532,157 | B1 * | 3/2003 | Glenn | H01L 31/0203 174/255 |
| 6,570,246 | B1 | 5/2003 | Lee et al. | |
| 6,591,492 | B2 | 7/2003 | Farrar | |
| 6,618,938 | B1 * | 9/2003 | Alagaratnam | H01L 23/49827 228/180.21 |
| 6,705,005 | B1 | 3/2004 | Blazier et al. | |
| 6,721,189 | B1 * | 4/2004 | Haba | H01R 12/714 174/254 |
| 6,777,261 | B2 | 8/2004 | Farnworth et al. | |
| 6,852,607 | B2 | 2/2005 | Song et al. | |
| 6,903,465 | B2 | 6/2005 | Farnworth et al. | |
| 6,966,784 | B2 * | 11/2005 | Van Schuylenbergh | H01R 12/78 361/261 |
| 7,012,812 | B2 * | 3/2006 | Haba | H01R 12/714 361/748 |
| 7,035,116 | B2 * | 4/2006 | Kuzmenka | G11C 5/00 361/679.32 |
| 7,115,984 | B2 | 10/2006 | Poo et al. | |
| 7,122,889 | B2 * | 10/2006 | Belgacem | H01L 23/36 257/696 |
| 7,148,428 | B2 * | 12/2006 | Meier | G06F 1/184 174/260 |
| 7,202,552 | B2 | 4/2007 | Zhe | |
| 7,211,886 | B2 * | 5/2007 | Hsu | H01L 25/0657 257/686 |
| 7,265,719 | B1 | 9/2007 | Moosbrugger et al. | |
| 7,351,072 | B2 * | 4/2008 | Muff | G11C 5/04 228/180.21 |
| 7,375,009 | B2 | 5/2008 | Chua et al. | |
| 7,420,262 | B2 | 9/2008 | Bauer et al. | |
| 7,429,788 | B2 | 9/2008 | Clayton et al. | |
| 7,467,552 | B2 | 12/2008 | MacGugan | |
| 7,692,102 | B2 * | 4/2010 | Kawakami | H05K 1/147 174/254 |
| 7,768,280 | B1 * | 8/2010 | Wright | G01R 31/2889 324/754.03 |
| 7,839,657 | B2 | 11/2010 | Nodine | |
| 7,851,829 | B2 * | 12/2010 | Theuss | G01P 1/023 257/254 |
| RE42,318 | E * | 5/2011 | Haba | H01L 23/36 361/58 |
| 8,174,111 | B2 * | 5/2012 | Xue | B81B 7/0048 257/254 |
| 8,217,507 | B1 * | 7/2012 | Galloway | H05K 1/028 257/668 |
| 8,520,401 | B2 * | 8/2013 | Tian | G06F 1/185 361/679.31 |
| 8,529,276 | B2 * | 9/2013 | Esquivel | H01R 12/716 439/492 |
| 8,624,380 | B2 * | 1/2014 | Xue | B81B 7/0048 257/254 |
| 8,692,366 | B2 * | 4/2014 | Xue | B81B 7/0074 257/692 |
| 8,821,167 | B2 * | 9/2014 | Ritner | H01R 12/771 439/67 |
| 8,836,132 | B2 * | 9/2014 | Xue | H01L 23/041 257/773 |
| 2003/0209789 | A1 | 11/2003 | Hanson et al. | |
| 2004/0041254 | A1 * | 3/2004 | Long | B81B 7/0048 257/703 |
| 2004/0157410 | A1 | 8/2004 | Yamaguchi | |
| 2004/0169244 | A1 | 9/2004 | MacGugan | |
| 2005/0136740 | A1 * | 6/2005 | Ludwig | H01R 13/6683 439/607.41 |
| 2005/0230795 | A1 | 10/2005 | Furuyama et al. | |
| 2006/0151864 | A1 | 7/2006 | Anderson et al. | |
| 2006/0261453 | A1 | 11/2006 | Lee et al. | |
| 2007/0053504 | A1 | 3/2007 | Sato | |
| 2008/0001241 | A1 * | 1/2008 | Tuckerman | H01L 31/0203 257/434 |
| 2008/0175425 | A1 | 7/2008 | Roberts et al. | |
| 2008/0205025 | A1 * | 8/2008 | Spooner | H01L 23/04 361/813 |
| 2008/0285111 | A1 | 11/2008 | Ishii et al. | |
| 2009/0121342 | A1 | 5/2009 | Minakawa et al. | |
| 2010/0078739 | A1 * | 4/2010 | Xue | B81B 7/0048 257/415 |
| 2010/0090295 | A1 | 4/2010 | Zhe | |
| 2010/0155863 | A1 | 6/2010 | Weekamp | |
| 2010/0197148 | A1 | 8/2010 | Rudisill et al. | |
| 2011/0018143 | A1 | 1/2011 | Chua et al. | |
| 2011/0141712 | A1 * | 6/2011 | You | H05K 1/11 361/782 |
| 2011/0149522 | A1 | 6/2011 | Johann et al. | |

OTHER PUBLICATIONS

Sensors—HARTING Mitronics, HARTING Pushing Performance, in 2 pages (downloaded from World Wide Web page: harting-mitronics.ch/en/produkte/anwendungen/sensorik/index.php on Jul. 11, 2011).

USPTO; Office Action dated Apr. 11, 2013, from related U.S. Appl. No. 13/085,294, filed Apr. 12, 2011.

* cited by examiner

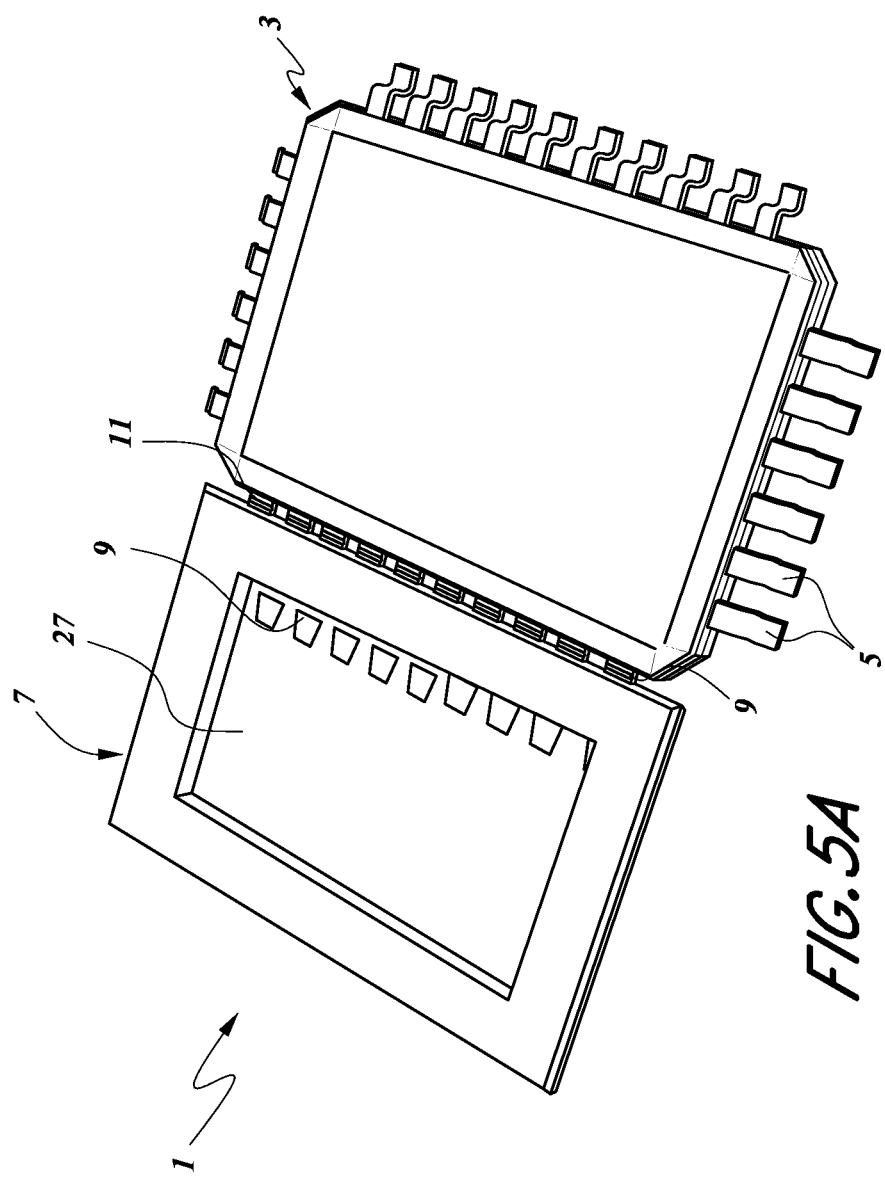

TWO-AXIS VERTICAL MOUNT PACKAGE ASSEMBLY

BACKGROUND OF THE INVENTION

1. Field of the Invention

Embodiments of the invention relate to vertical mount packages for integrated circuits or microelectromechanical systems (MEMS) devices.

2. Description of the Related Art

Microelectromechanical systems (MEMS) devices can include one or more of mechanical elements, sensors, and actuators formed on a substrate, such as a silicon substrate, through micro fabrication technology. Such MEMS devices in a state before packaging can also be referred to as a "MEMS die" in the context of this document. In this document, "dies" is used as a plural form of "die," but "dice" can also be used as a plural form.

MEMS dies are typically placed in a package (hereinafter, referred to as "MEMS package") to protect the MEMS dies and facilitate electrical connection to larger electronic devices. Such MEMS packages are often designed to be mounted on a printed circuit board (PCB) or similar interface for larger devices. A MEMS package can be encapsulated or overmolded, but often will instead include a casing defining a cavity to contain a MEMS die, bond pads for electrical connection to the MEMS die, leads for electrical connection to a larger device, and interconnects for electrical connection between the bond pads and the leads. A MEMS die is attached to a mounting surface of the MEMS package, and can be electrically connected to the bond pads, e.g., via bond wires. The cavity can be defined in various ways, such as a substrate (e.g., PCB) and metal "can" or three-dimensional lid, a molded package with integrated substrate and walls with a planar lid, etc.

Other devices, such as application-specific integrated circuits (ASICs) for processing MEMS signals and/or memory chips, can be similarly packaged for protection and to facilitate electrical connection of devices to larger electrical circuits. Such IC dies can be independently packaged or packaged together with MEMS devices.

Most packages are designed to mount onto larger boards with the die parallel to the mounting board. Dies that are to be mounted vertically with respect to the mounting surface, such as gyroscopes and other MEMS motion sensors, present additional challenges for efficient component manufacturing and assembly of packages.

SUMMARY OF THE INVENTION

In one embodiment, a vertical mount package assembly comprises a base substrate having electrical connections for affixing to external circuitry, a package having a device region configured to receive at least one device, and a plurality of flexible electrical leads between the base substrate and the package. The flexible leads can include aligned grooves.

In some embodiments, the package can be fixed in a position substantially perpendicular to the base substrate. In some embodiments, the base substrate and the package each include beveled edges configured to mate. In some embodiments, the package is fixed with an adhesive between the base substrate and the package.

In some embodiments, the vertical mount package assembly can further include a MEMS die on the device region of the package. In some embodiments, the plurality of flexible electrical leads can provide electrical communication between the MEMS die and the electrical connections of the base substrate. In some embodiments, the base substrate can further include an integrated circuit communicating with the flexible electrical leads and the electrical connections. In some embodiments, the MEMS die can include at least one of an accelerometer and a gyroscope.

In another embodiment, a vertical mount package assembly includes a base substrate having electrical connections for affixing to external circuitry, a package having a device region configured to receive at least one device, and a plurality of flexible electrical leads between the base substrate and the package. Each of the base substrate and the package can include beveled edges configured to mate when the base substrate and package are substantially orthogonal to one another. In some embodiments, the vertical mount package assembly can further include a MEMS die on the device region of the package. In some embodiments, the MEMS die comprises at least one of: an accelerometer and a gyroscope.

In another embodiment, a method of manufacturing a vertical mount package assembly is provided. The method can comprise providing a base, wherein the base includes electrical connections for affixing to external circuitry. A package can be provided, wherein the package includes a device region configured to receive at least one device. Flexible electrical leads between the base and the package can be provided, wherein the flexible leads include aligned grooves. The method can further include rotating the package relative to the base substrate, such that the package is substantially perpendicular to the base substrate. The aligned grooves can constrain the relative positions of the substrates during rotation, and wherein the flexible electrical leads maintain the connection between the base substrate and the package after rotation.

BRIEF DESCRIPTION OF THE DRAWINGS

FIG. 5A is a perspective top view of a vertical mount package assembly prior to rotation of the package, according to one embodiment.

DETAILED DESCRIPTION OF EMBODIMENTS

Figure 1A:
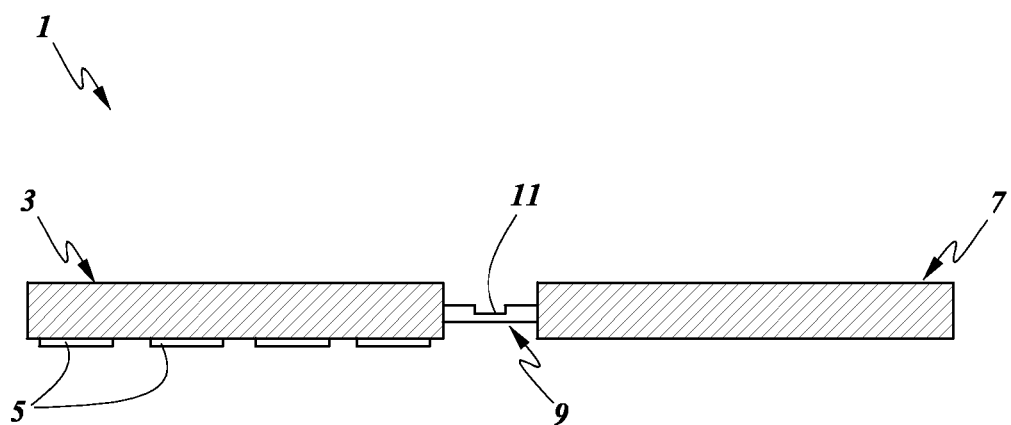
FIGS. 1A and 1B are schematic side views of a vertical mount package assembly before and after rotation of the package.

The following detailed description of certain embodiments presents various descriptions of specific embodiments of the invention. However, the invention can be embodied in a multitude of different ways as defined and covered by the claims. In this description, reference is made to the drawings where like reference numerals indicate identical or functionally similar elements.

Two-Axis Vertical Mount Package Assembly

A MEMS package is designed to protect a MEMS device and facilitate electrical connection to larger electronic devices. In some applications, a MEMS package can be mounted on a printed circuit board (PCB) or other interface with an external device such that a MEMS device therein is oriented substantially parallel to a mounting surface of the external device. In other applications, a MEMS package desirably has a MEMS device therein oriented at an angle, e.g., substantially perpendicular, to the mounting surface because of the operation of the MEMS device.

For example, in some automotive applications, such as vehicle stability control devices, rotation or angular sensors (alternatively, referred to as "gyroscopes") and/or MEMS static motion sensors (alternatively, referred to as "accelerometers") are oriented vertically on a horizontally mounted part inside a vehicle. In the context of this document, the term "vertical" can refer to the orientation approximately perpendicular to the package mounting plane (e.g., on a motherboard), which can be, but is not necessarily, parallel to ground. Rotation sensors and motion sensors can be collectively referred to as "inertial sensors."

Such inertial sensors can be oriented vertically using a vertical mount package, which is configured to mount a sensor die vertically and make electrical connections to a horizontal mounting surface. However, known schemes for vertical mount packages can be expensive and have several limitations. Many vertical mount packages rely on pre-molded packages or ceramic, both of which are expensive. Additionally, vertical mount packages can be more susceptible to vibration and package tilt than horizontal mount packages. Accordingly, there is a need for providing a vertical mount package that can incorporate mature packaging technologies to reduce overall cost. Among other attributes, vertical mount packages should have low height and low manufacturing costs while maintaining or improving overall performance.

In one embodiment, a vertical mount package assembly can include a package and a base substrate. The base substrate can include electrical connections for affixing to external circuitry. The package can include one or more of device regions. The package further includes a plurality of flexible electrical leads extending between the base and the package. The package can take the form of a cavity package in which the device regions are positioned within the cavity and are configured to receive MEMS or IC dies. The MEMS or IC dies can be separately formed, diced, and mounted onto the device regions. In some embodiments, the package can take the form of an overmolded leadframe package. In some embodiments, the package can take the form of a laminate substrate having a die mounted thereon, encapsulated with glob top or other material. Electrical connections between the device regions and the flexible leads can be provided, such that the dies of the package can be in electrical communication with the base substrate.

The base substrate can serve to make electrical connections between the device(s) of the package and the external circuitry. The base substrate can additionally serve as a second package in the package assembly, e.g., for an ASIC that processes signals from an inertial motion sensor in the vertical package.

Figure 1B:
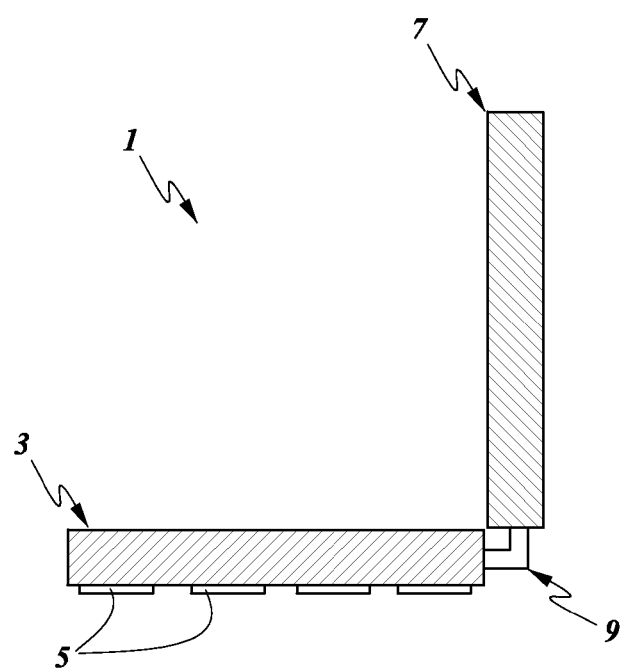

FIGS. 1A and 1B are schematic side views of a vertical mount package assembly 1, before and after rotation. As illustrated, the vertical mount package assembly 1 includes a base substrate 3 and a package 7. The base substrate 3 includes a plurality of leads 5 for providing electrical connection to an external device. For example, the leads 5 can include a plurality of bond pads on the bottom surface of the base substrate 3. In some embodiments, solder bumps can be attached to the bond pads. In other embodiments, the leads 5 can be exposed portions of a leadframe extending laterally from the sides of the base substrate 3. In other embodiments, the leads 5 can electrically communicate with contacts or wire-bond pads arranged on an upper surface of the base substrate for connecting to die(s) mounted thereupon. The base substrate 3 can take any number of forms. For example, in various embodiments, the base substrate 3 can be made of ceramic, plastic, molding compound, or PCB.

Flexible electrical leads 9 connect the base substrate 3 to the package 7. As illustrated in FIG. 1A, the flexible electrical leads 9 include a crease or groove 11 formed therein. In the illustrated embodiment, the groove 11 is substantially rectangular in cross-section. However, in other embodiments the groove can take any number of shapes, for example triangular, curved, or trapezoidal. In some embodiments, the groove 11 may be omitted. The groove 11 can be formed by a variety of methods. For example, the groove 11 can be stamped into a pre-formed leadframe. In other embodiments, the groove 11 can be formed by standard photolithography followed by a half-etch of the flexible electrical leads 9. Alternatively, a laser drill can be used to form the groove 11. Moreover, as will be clear from the discussion of FIGS. 5A-5B below, multiple leads between the base substrate 3 and the package 7 have aligned grooves 11 to facilitate controlled bending during assembly.

As shown in FIG. 1B, the package 7 can be rotated with respect to the base substrate 3. The flexible leads 9 remain intact following rotation of the package 7. The groove 11 can be configured to facilitate aligned bending of the flexible electrical leads 9 during rotation of the package 7.

The package 7 can include therein a device region configured to receive a device thereon. For example one or more MEMS or IC dies may be enclosed within the package 7. The package 7 is illustrated schematically, but may take any number of forms. For example, the package 7 can be a cavity package housing the device within the cavity and an optical lid for environmental protection. In some embodiments, the package 7 can be an overmolded leadframe package. In other embodiments, the package 7 can comprise a laminate substrate, with glob top or other adhesive encapsulating an IC or MEMS device. Various other types of packages can be employed, so long as flexible electrical leads 9 can be provided that extend between the package 7 and the base substrate 3, and wherein the flexible electrical leads 9 are in electrical communication (whether direct or indirect) with the die enclosed within the package 7.

In some embodiments, the package 7 can be rotated to be aligned with a plane substantially perpendicular to the plane of the base substrate 3. In other embodiments, the alignment of the package can vary. For example, the package can be rotated with respect to the base substrate to form an angle of intersection ranging from 45 to 135 degrees. Following rotation of the package 7 with respect to the base substrate 5, the relative orientations of the two can be externally fixed. For example, epoxy (not shown) can be applied to the joint between the package 7 and the base substrate 3. Various other adhesives may alternatively be used to fix the position of the package 7 with respect to the base substrate 3, and may also encapsulate the flexible electrical leads 9. As discussed in more detail below, in some embodiments the sides of the package and the base substrate can be beveled so as to form a joint at a specified angle.

As shown in FIG. 1B, the rotated package 7 is positioned substantially vertically, while the base substrate 3 remains substantially horizontal. The leads 5 on the base substrate 3 can provide for electrical connection to external devices. For example, the base substrate 3 can be mounted onto the mounting board of an external device or system, and electrically connected thereto through leads 5. Upon mounting, the package 7 is aligned vertically, while the base substrate 3 provides both mechanical and electrical connection to the external system, for example a PCB. Internal electrical connections are provided between the leads 5 of the base substrate and the flexible electrical leads 9. Similarly, as noted above, the flexible electrical leads 9 can be internally connected to a device within the interior of the package 7. In some embodiments, the base substrate 3 may itself comprise a package housing a device therein. In other embodiments, the base substrate 3 may be a simple substrate, such as PCB or a molded leadframe, having electrical connections therein but containing no devices therein.

Figure 2A:
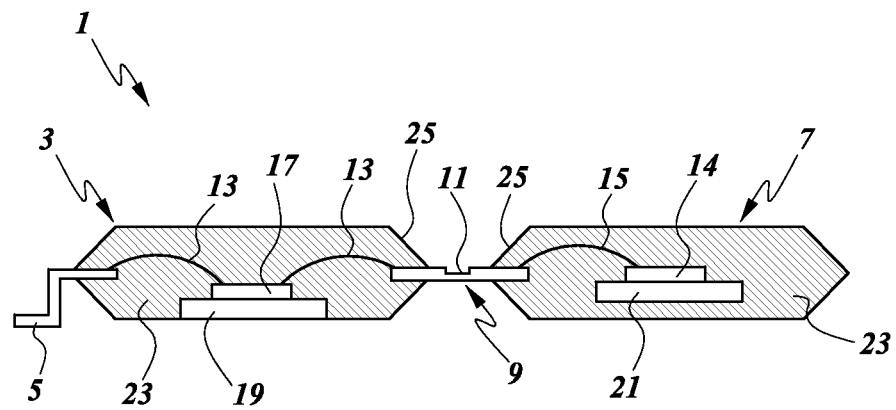
FIGS. 2A-4B are schematic cross-sections of various embodiments of a vertical mount package assembly before and after rotation of the package.
Figure 2B:
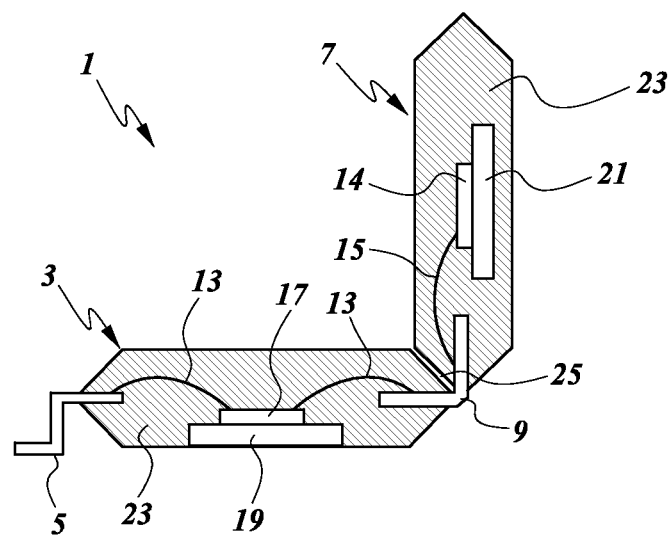

Referring to FIGS. 2A and 2B, one embodiment of the vertical mount package assembly 1 is shown in cross-section, both before and after rotation of the package. Similar to the embodiment described above with respect to FIGS. 1A and 1B, a base substrate 3 is connected via flexible electrical leads 9 to a package 7. The base substrate 3 includes leads 5 for external electrical connection. In the illustrated embodiment, the leads 5 comprise exposed portions of a leadframe extending laterally from the side of the base substrate 3. As with FIG. 1A, the flexible electrical leads 9 include a crease or groove 11 formed therein. In various embodiments, the groove 11 can be formed by stamping the leadframe, by chemical etching, laser drilling, or mechanical drilling. The groove can be aligned across a plurality of flexible electrical leads so as to ensure the proper alignment between the base substrate 3 and the package 7 during and after relative rotation during assembly.

The base substrate 3 itself comprises an overmolded leadframe package. For example, the base substrate 3 can be a thin quad-flat package (TQFP) with an exposed die pad 19 on the bottom surface. An IC die 17 or other device, particularly an ASIC for processing signals from a MEMS device, can be mounted onto the die pad 19. In some embodiments, the IC die can be replaced with a MEMS device. Wire bonds 13 provide electrical connection between the IC die 17 and both the leads 5 and the flexible electrical leads 9. A molding compound 23 covers the IC die 17, wire bonds 13, die pad 19, and portions of the leads 5 and flexible electrical leads 9. The bottom portion of the die pad 19 is exposed, allowing thermal conduction away from the encapsulated IC die 17.

The package 7 can also comprise an overmolded leadframe package. The die attach pad 21 includes a device 14 mounted therein. The die attach pad 21 is one example of a "device region" in which a device is configured to be mounted. As noted previously, the device 14 can be a MEMS or IC die. For example, a MEMS die can be separately fabricated, singulated, and attached to the die attach pad 21 of the package 7. Wire bonds 15 provide electrical connection between the device 14 and the flexible electrical leads 9. Similar to the base substrate 3, a molding compound 23 covers the die attach pad 21, device 14, wire bonds 15, and a portion of the flexible electrical leads 9. As will be understood, in some embodiments the leadframe can comprise the die attach pad 21 and the flexible electrical leads 9. After mounting the device 14, the molding compound 23 can be molded thereover.

Both the base substrate 3 and the package 7 can include beveled edges 25. The angle of the beveled edges 25 can define the relative orientation of the base substrate 3 and the package 7 following rotation of the package 7. For example, in the illustrated embodiment the beveled edges 25 are angled at approximately 45 degrees. When the package 7 is rotated vertically, the two beveled edges 25 meet, restraining the package 7 in a position substantially orthogonal to the base substrate 3. With the base substrate 3 mounted horizontally, therefore, the package 7 is aligned vertically. Having one bevel of 30 degrees and the other bevel of 60 degrees can also provide an orthogonal orientation. As noted above, angles other than 90 degrees are possible.

In the illustrated vertical mount package assembly 1, the device 14 is in electrical communication with the IC die 17 through a series of wire bonds 13 and 15, and the flexible electrical leads 9. The IC die 17 in turn is in electrical communication with the external leads 5, which can then be physically mounted and electrically connected to another surface, for example the mounting board of an external system or device. The IC die 17 can be, for example an application-specific IC (ASIC) configured to function in concert with the device 14. Alternatively, the IC die 17 can be a general purpose processor. The device 14, as noted above, can be a MEMS device or an IC die. Some examples of possible MEMS devices include gyroscopes and accelerometers.

Figure 3A:
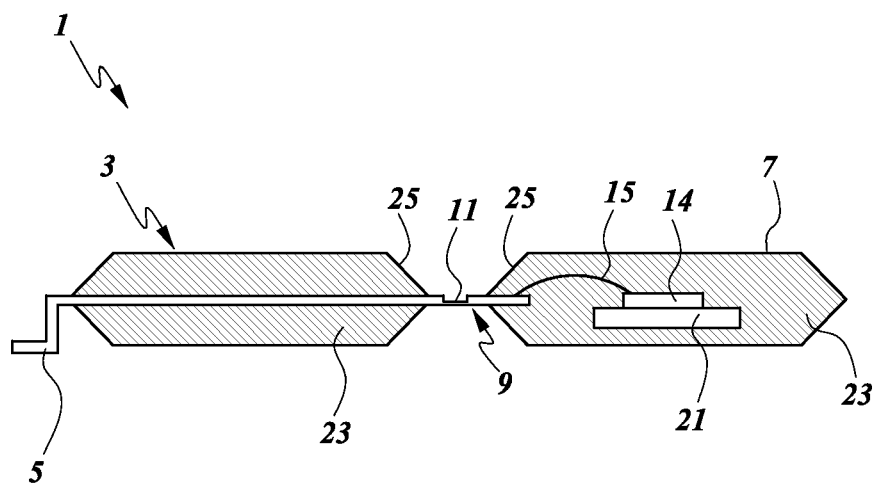
Figure 3B:
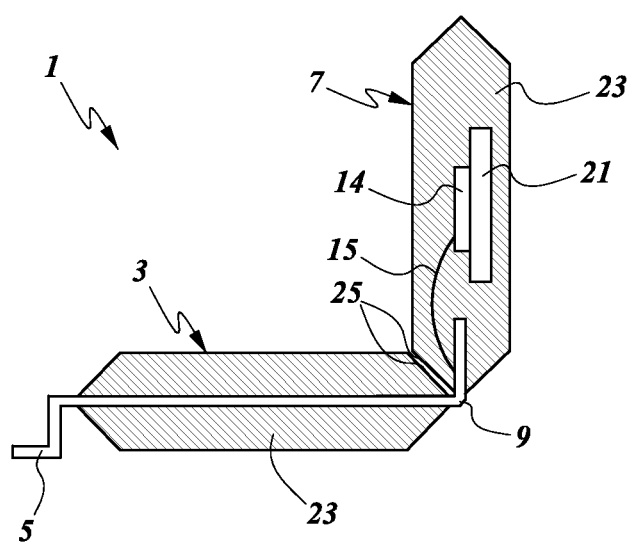

Referring to FIGS. 3A and 3B, another embodiment of the vertical mount package assembly 1 is shown in cross-section, both before and after rotation of the package. Similar to the embodiments described above, a base substrate 3 is connected via flexible electrical leads 9 to a package 7. The base substrate 3 includes leads 5 for external electrical connection. In the illustrated embodiment, the leads 5 comprise exposed portions of a leadframe extending laterally from the side of the base substrate 3. As with FIG. 1A, the flexible electrical leads 9 include a crease or groove 11 formed therein. In various embodiments, the groove 11 can be formed by stamping the leadframe, by chemical etching, laser drilling, or mechanical drilling. The groove can be aligned across a plurality of flexible electrical leads so as to ensure the proper alignment between the base substrate 3 and the package 7 during and after relative rotation during assembly.

In the illustrated embodiment, the base substrate 3 itself comprises an overmolded leadframe, but no IC or other device is enclosed therein. Accordingly, the external leads 5 can be directly connected to the flexible electrical leads 9. As will be understood, in this simplified cross-section only one external lead 5 and one flexible electrical lead 9 are shown. In practice, arbitrary numbers of leads can be used. For example, in some embodiments there may be 10 or more separate flexible electrical leads 9 can extend between the base substrate 3 and the package 7. A molding compound 23 covers portions of the leads 5 and flexible electrical leads 9. As noted previously, the external leads 5 can provide for electrical connection to external surfaces, such as PCB.

The package 7 can be similar to that described above with respect to FIGS. 2A and 2B. The die attach pad 21 includes a device 14 mounted thereon, with wire bonds 15 providing electrical connection between the device 14 and the flexible electrical leads 9. Similar to the base substrate 3, a molding compound 23 covers the die attach pad 21, device 14, wire bonds 15, and a portion of the flexible electrical leads 9.

Both the base substrate 3 and the package 7 can include beveled edges 25 to define the relative orientation of the base substrate 3 and the package 7 following rotation of the package 7. When the package 7 is rotated vertically, the two beveled edges 25 meet, restraining the package 7 in a position substantially orthogonal to the base substrate 3. With the base substrate 3 mounted horizontally, therefore, the package 7 is aligned vertically. As noted above, bevels can be angled at other than 45 degrees, and the base substrate 3 and package 7 can be oriented at other than 90 degrees.

Figure 4A:
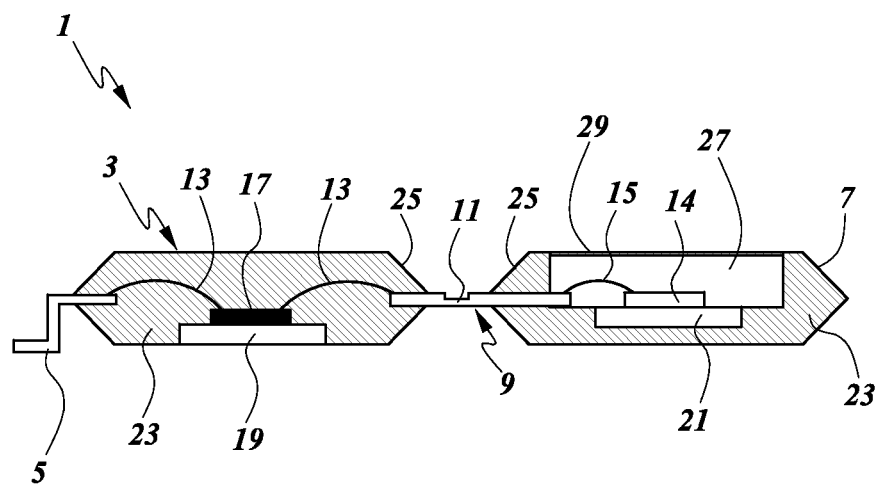
Figure 4B:
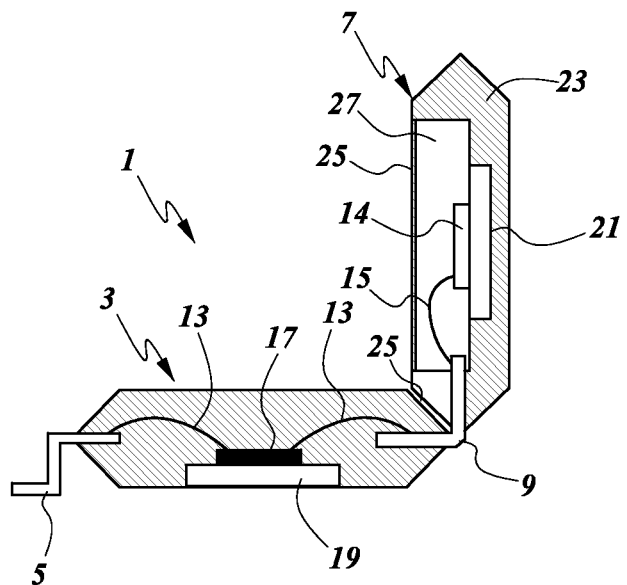

Referring to FIGS. 4A and 4B, another embodiment of the vertical mount package assembly 1 is shown in cross-section, both before and after rotation of the package. Similar to the embodiments described above, a base substrate 3 is connected via flexible electrical leads 9 to a package 7. The base substrate 3 includes leads 5 for external electrical connection. In the illustrated embodiment, the leads 5 comprise exposed portions of a leadframe extending laterally from the side of the base substrate 3. The flexible electrical leads 9 include a crease or groove 11 formed therein. In various embodiments, the groove 11 can be formed by stamping the leadframe, by chemical etching, laser drilling, or mechanical drilling. The groove can be aligned across a plurality of flexible electrical leads so as to ensure the proper alignment between the base substrate 3 and the package 7 during and after relative rotation during assembly.

As with the embodiment illustrated in FIG. 2A, the base substrate 3 itself comprises an overmolded leadframe package. The base substrate 3 can include an exposed pad 19 on the bottom surface, an IC die 17 mounted onto the exposed pad 19, and wire bonds 13 providing electrical connection between the IC die 17 and both the leads 5 and the flexible electrical leads 9. A molding compound 23 covers the IC die 17, wire bonds 13, die pad 19, and portions of the leads 5 and flexible electrical leads 9. The bottom portion of the die pad 19 is exposed, allowing for thermal communication from the encapsulated IC die 17.

The package 7 can comprise a cavity package. A cavity 27 is formed within the package 7, with a lid 29 mounted over the top surface of the cavity 27. Within the cavity 27, a die attach pad 21 includes a device 14 mounted thereon. The die attach pad 21 is one example of a "device region" in which a device is configured to be mounted. As noted previously, the device 14 can be a MEMS or IC die. For example, a MEMS die can be separately fabricated, singulated, and attached to the die attach pad 21 of the package 7. Wire bonds 15 provide electrical connection between the device 14 and the flexible electrical leads 9. A molding compound 23 defines the structure of the package 7 surrounding the cavity 27. A portion of the flexible electrical leads 9 extends into the cavity 27, allowing for a point of connection (via wire-bonds 15) between the flexible electrical leads 9 and the device 14.

As noted previously, the beveled edges 25 on each of the base substrate 3 and the package can define the relative orientation of the base substrate 3 and the package 7 following rotation of the package 7. Accordingly, when the package 7 is rotated vertically, the two beveled edges 25 meet, restraining the package 7 in a position substantially orthogonal to the base substrate 3. With the base substrate 3 mounted horizontally, therefore, the package 7 is aligned vertically. As noted above, bevels can be angled at other than 45 degrees, and the base substrate 3 and package 7 can be oriented at other than 90 degrees.

In the illustrated vertical mount package assembly 1, the device 14 is in electrical communication with the IC die 17 through a series of wire bonds 13 and 15, and the flexible electrical leads 9. The IC die in turn is in electrical communication with the external leads 5, which can then be physically mounted and electrically connected to another surface, for example PCB. The IC die 17 can be, for example an application-specific IC (ASIC) configured to function in concert with the device 14. Alternatively, the IC die 17 can be a general purpose processor. The device 14, as noted above, can be a MEMS device or an IC device. Some examples of possible MEMS devices include gyroscopes and accelerometers.

As noted above, in some embodiments, wire bonds may be used to provide connections between the device and the flexible electrical leads, as well as between the flexible electrical leads and an ASIC within the base substrate. In other embodiments, electrical connection may be provided using flip-chip methods, as is known in the art. For example, the flexible electrical leads may extend into the device region of the package. The device can then be affixed directly onto the flexible electrical leads with a conductive adhesive, such as solder. In some embodiments, anisotropic conducting film or nonconducting paste may be used to provide electrical and mechanical connection between the device and the flexible electrical leads.

FIG. 5A is a schematic perspective top view of a vertical mount package assembly prior to rotation of the package, according to one embodiment. In the illustrated embodiment, the package 7 comprises a cavity package, having a cavity 27 exposed to a top surface. The device and the cavity lid have been omitted in FIG. 5A. As discussed previously, flexible electrical leads 9 extend between the base substrate 3 and the package 7, and extend partially into the cavity 27. A plurality of external leads 5 are arranged around each of the sides of the base substrate 3, except for the side directly adjacent the package 7. A crease is defined by grooves 11 is formed along the center of the flexible electrical leads 9, in the exposed portion between the base substrate 3 and the package 7. Beveled edges 25 on each of the base substrate 3 and package 7 can provide for a fixed relative orientation, as described in more detail herein.

Figure 5B:
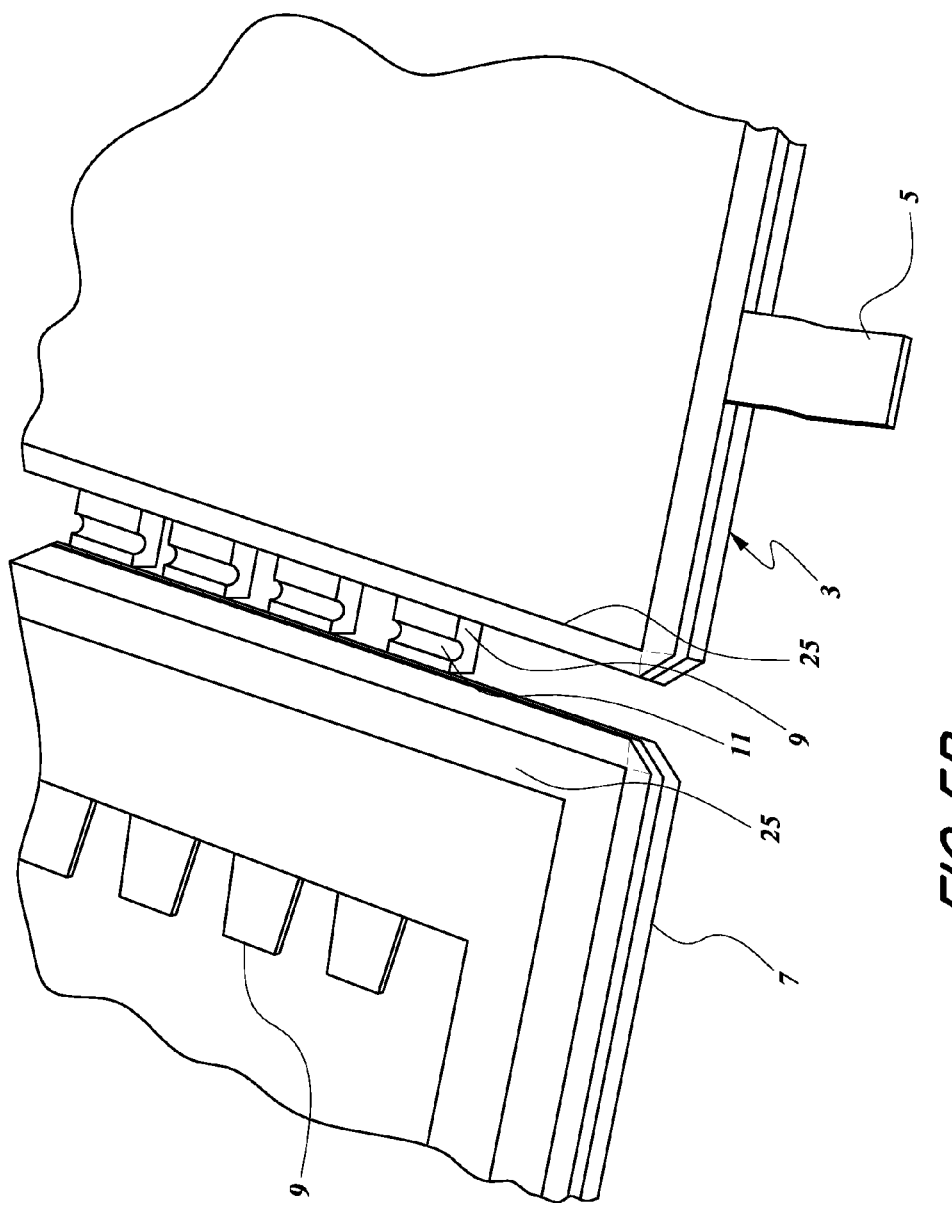
FIG. 5B is an enlarged detail view showing the flexible electrical leads of FIG. 5A.

FIG. 5B is an enlarged detail view of the flexible electrical leads shown in FIG. 5A. As noted previously, the grooves 11 can be substantially aligned to facilitate proper rotation of the package 7 with respect to the base substrate 3. The grooves can be formed by stamping a leadframe, by chemical etching, laser drilling, or mechanical drilling. In some embodiments the flexible electrical leads 9 can be spaced with an approximately 1 mm pitch, and each flexible electrical lead 9 can have a width of approximately 0.5 mm.

The cavity in the package can take a number of forms. In some embodiments, similar to that illustrated in FIGS. 5A and 5B, a recess is formed in a package substrate, and a lid is positioned thereover to define an enclosed cavity. In other embodiments, a planar package substrate can have arranged thereover a three-dimensional cap or lid that defines a cavity therebetween. In other embodiments, a flat lid may be arranged over a flat substrate, with intermediate printed circuit board (PCB) or other material disposed between the lid and the substrate, defining the cavity therebetween which can encapsulate a device. In various embodiments, the package substrate and/or lid can be made of ceramic or molded plastic.

Figure 6A:
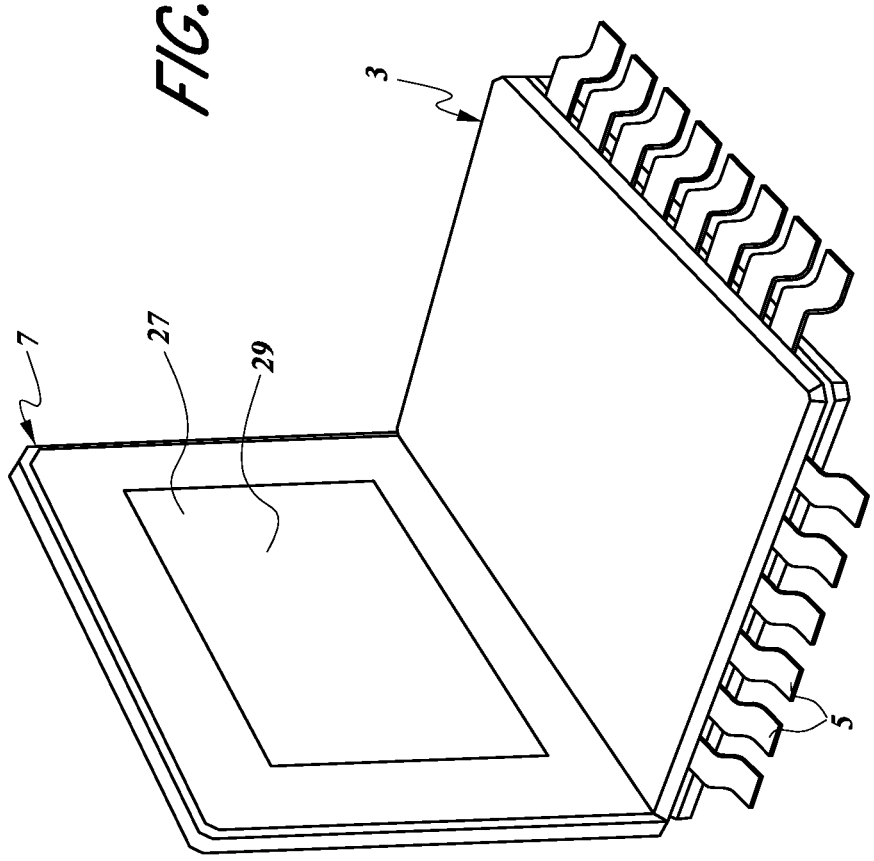
FIG. 6A is a perspective front view of a vertical mount package assembly after rotation of the package.
Figure 6B:
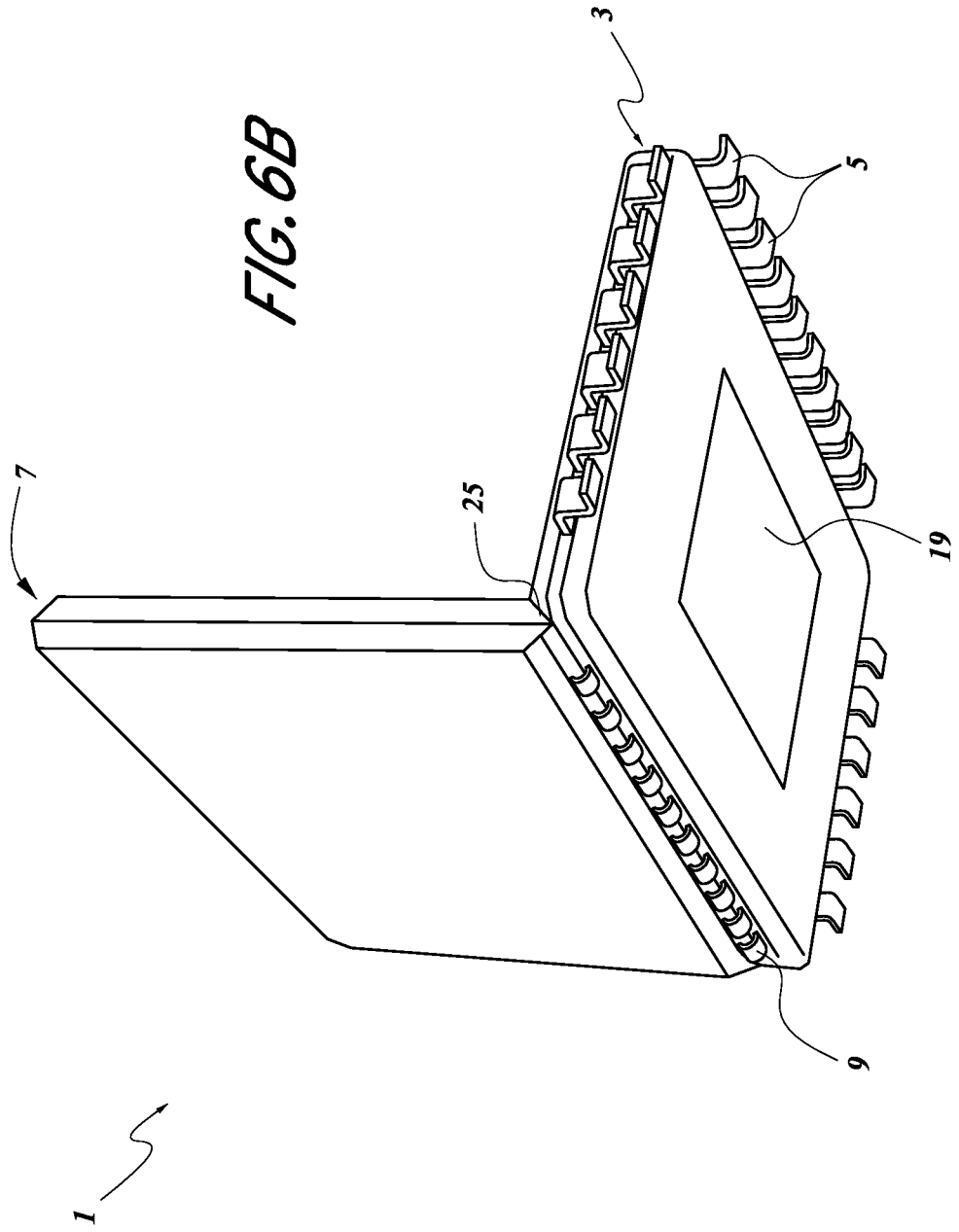
FIG. 6B is a perspective rear view of a vertical mount package assembly after rotation of the package.
Figure 6C:
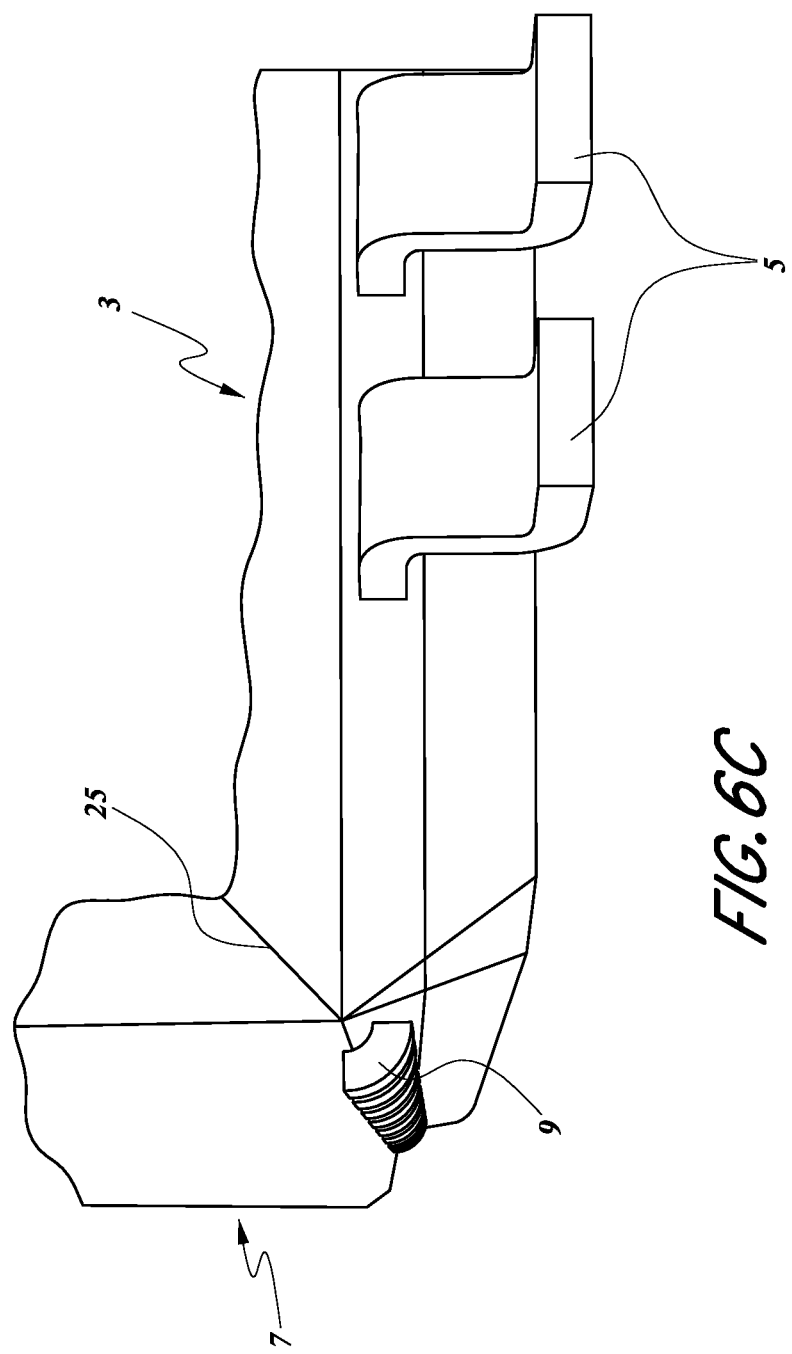
FIG. 6C is an enlarged detail view of the connection between the package and the base shown in FIGS. 6A and 6B.

FIGS. 6A and 6B are a perspective front and rear views, respectively, of a vertical mount package assembly after rotation of the package. FIG. 6C is an enlarged detail view of the connection between the package and the base substrate shown in FIGS. 6A and 6B. The package 7 illustrated after relative rotation and fixing, and a lid 29 enclosing the cavity 27. A device (not shown), such as a MEMS accelerometer or gyroscope, is mounted within the cavity 27 and electrically connected to the flexible electrical leads 9. Upon rotation, the beveled edges 25 of the package 7 and the base substrate 3 join such that the package 7 is aligned substantially perpendicular to the base substrate 3. Upon attaching the base substrate 3 to a horizontal surface, the package 7 is then vertically aligned. As noted previously, adhesive, such as epoxy (not shown) may be applied to the adjacent beveled edges to fix the relative positions of the package 7 and the base substrate 3 after rotation.

The exposed die pad 19 is shown on the bottom surface of the base substrate 3 in FIG. 6B. The base substrate 3 can be mounted to an external surface, such as PCB, by solder or other connection between the plurality of external leads 5 and optionally the exposed die pad 19. As noted above, the device (not shown) mounted within the package 7 is in electrical communication with the external leads 5 through the plurality of flexible electrical leads 9.

Figure 7:
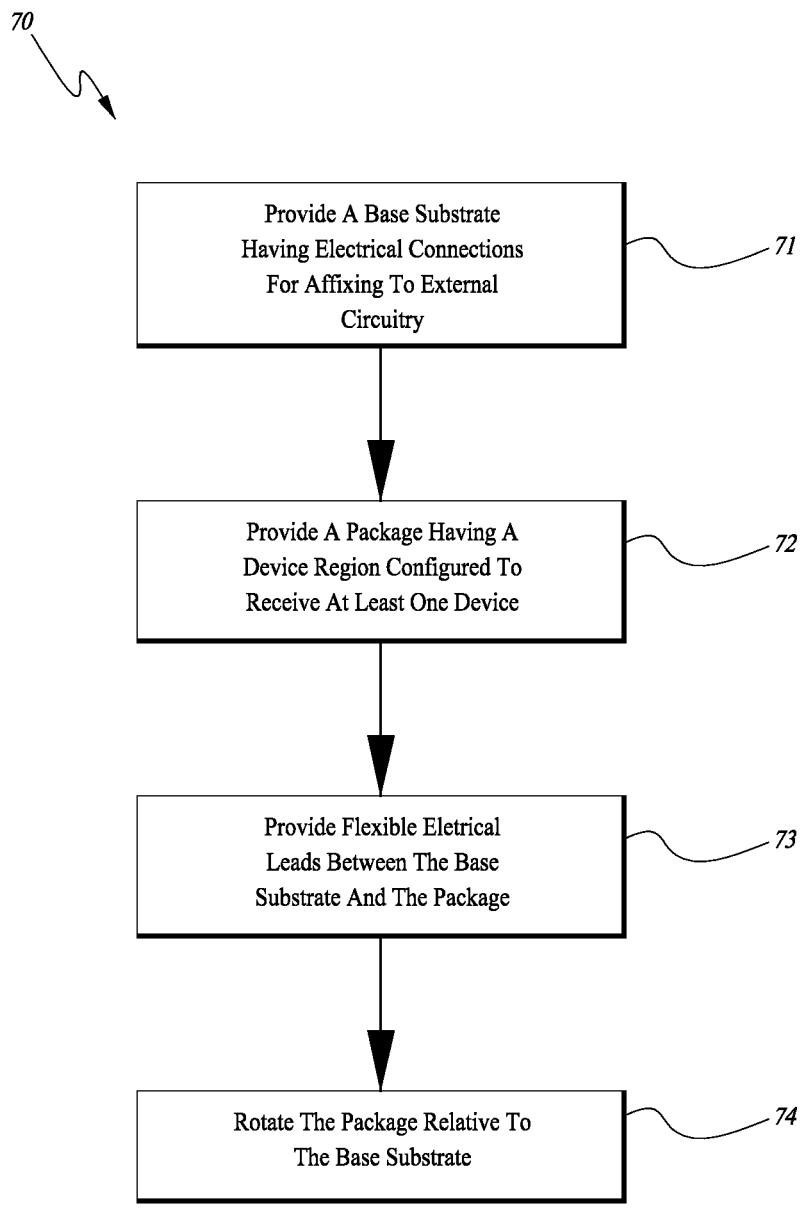
FIG. 7 is a flow diagram illustrating a method of making a vertical mount package assembly according to one embodiment.

Turning now to FIG. 7, a flow diagram illustrates a method for manufacturing a vertical mount package assembly in one embodiment. The method need not be performed in the illustrated sequence. A base substrate is provided in block 71 that includes a electrical connections for affixing to external circuitry. The base substrate can take the form of an overmolded leadframe package, in one embodiment. In some embodiments, the base substrate can comprise a package configured to receive a device within the cavity. In other embodiments, the base substrate can comprise an overmolded leadframe with no device enclosed therein.

A package is provided in block 72 that includes a device region configured to receive at least one device. The devices can include MEMS or ICs, and can be separately manufactured and then mounted onto the device regions. The devices, particularly IC's, can be sealed onto the device regions by covering them with epoxy or standard deposited passivation layers used in semiconductor fabrication, such as SiON layers. MEMS devices, particularly motion sensors, are preferably not encapsulated to avoid stress. Rather, a cavity package can be provided in block 72 and a separate lid can be mounted over the device region, thereby sealing the devices on the device regions within sealed cavities and allowing free MEMS beam or membrane movement, either by individual planar or shaped three-dimensional lids.

Flexible electrical leads between the base substrate and the package are formed in block 73. In some embodiments, the flexible electrical leads can be integral to the leadframes of both the base substrate and the package. In other embodiments, the flexible electrical leads can be integral only to the leadframe of one or the other of the base substrate and the package. As described elsewhere herein, electrical connections internally within the package and/or base substrate can be provided between the flexible electrical leads and packaged devices by wire-bonds. In other embodiments, other electrical connections can be provided, for example direct or indirect physical contact in flip-chip arrangements.

The package is rotated in block 74 relative to the base substrate. The package can be rotated such that it is oriented substantially perpendicular to the base substrate. In other embodiments, the package can be rotated to a different orientation with respect to the base substrate. As noted above, beveled edges on each of the base substrate and the package can join cooperatively to form an orthogonal configuration. In some embodiments, each substrate can have a beveled edge angled at approximately 45 degrees.

In some embodiments, all processing steps—e.g., mounting devices, wire-bonding connections, placing a lid over the cavity, and affixing the base substrate to external circuitry, can take place prior to block 74, while the package is substantially coplanar with the base substrate. In such embodiments, the package can be rotated after each of these processing steps has been performed. Epoxy or other adhesive may then be applied to fix the vertical orientation of the package. In other embodiments, the package may be rotated prior to one or more of the processing steps mentioned above. For example, in some embodiments the package may be rotated and fixed with adhesive prior to mounting the base substrate onto external circuitry.

Applications

The embodiments described above can be adapted for various types of MEMS devices, including, but not limited to: optical sensors, RF MEMS, inertial sensors (for example, gyroscopes and accelerometers), MEMS thermal sensors, microphone, and pressure sensors. The packages have particular utility for packaging vertically mounted sensors, such as gyroscopic angular motion sensors, to achieve the detection at a certain orientation. For such applications, the devices can be hermetically sealed within package cavities, and the simple construction is particularly robust for environments (e.g., automobiles) subject to high vibrations.

More generally, "vertical" packages employing the above described configurations can be used for various electronic devices. Examples of the electronic devices can include, but are not limited to, consumer electronic products, parts of the consumer electronic products, electronic test equipments, etc. The consumer electronic products can include, but are not limited to, vehicles (for example, stability control devices), a mobile phone, cellular base stations, a telephone, a television, a computer monitor, a computer, a hand-held computer, a netbook, a tablet computer, a digital book, a personal digital assistant (PDA), a game controller, a GPS, a stereo system, a cassette recorder or player, a DVD player, a CD player, a VCR, a DVR, an MP3 player, a radio, a camcorder, a camera, a digital camera, a portable memory chip, a copier, a facsimile machine, a scanner, a multi functional peripheral device, a wrist watch, a clock, etc. Further, the electronic device can include unfinished products.

The foregoing description and claims may refer to elements or features as being "mounted" or "attached" together. As used herein, unless expressly stated otherwise, "mounted" means that one element/feature is directly or indirectly connected to another element/feature. Likewise, unless expressly stated otherwise, "attached" means that one element/feature is directly or indirectly coupled to another element/feature, such as by way of adhesive layers. Thus, although the various schematics shown in the figures depict example arrangements of elements and components, additional intervening elements, devices, features, or components may be present in an actual embodiment.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. A vertical mount package assembly comprising:
a base substrate having electrical connections for affixing to external circuitry;
a package having a device region configured to receive at least one device; and
a plurality of spaced apart electrical leads between the base substrate and the package, wherein the leads include aligned grooves, each groove comprising a surface recess to provide alignment between the base and the package, the grooves being aligned along a crease of the leads.

2. The vertical mount package assembly of claim 1, wherein the package is fixed in a position substantially perpendicular to the base substrate.

3. The vertical mount package assembly of claim 2, wherein the base substrate and the package each include beveled edges configured to mate.

4. The vertical mount package assembly of claim 2, wherein the package is fixed with an adhesive between the base substrate and the package.

5. The vertical mount package assembly of claim 4, wherein the adhesive comprises epoxy.

6. The vertical mount package assembly of claim 1, further comprising a MEMS die on the device region of the package.

7. The vertical mount package assembly of claim 6, wherein the plurality of electrical leads provide electrical communication between the MEMS die and the electrical connections of the base substrate.

8. The vertical mount package assembly of claim 6, wherein the base substrate further comprises an integrated circuit communicating with the electrical leads and the electrical connections.

9. The vertical mount package assembly of claim 6, wherein the MEMS die comprises at least one of: an accelerometer and a gyroscope.

10. A method of manufacturing the vertical mount package assembly of claim 1, the method comprising:
providing the base substrate;
providing the package; and
rotating the package relative to the base substrate, wherein the aligned grooves constrain the relative positions of the base substrate during rotation, and wherein the electrical leads maintain the connection between the base substrate and the package after rotation.

11. The vertical mount package assembly of claim 1, wherein the electrical leads maintain the relative position of the base and the package without a bracket.

12. The vertical mount package assembly of claim 1, wherein the electrical leads comprise exposed portions of a leadframe.

13. The vertical mount package assembly of claim 1, wherein the aligned grooves of the electrical leads are aligned along an axis parallel to a bend of the electrical leads.

14. The vertical mount package assembly of claim 1, wherein the recess is substantially rectangular or curved in cross-section.

15. The vertical mount package assembly of claim 1, wherein the base and the package intersect at an angle from 45 degrees to 135 degrees.

16. The vertical mount package assembly of claim 1, the vertical mount package assembly being configured to sense motion along two axes.

17. The vertical mount package assembly of claim 1, wherein the base substrate comprises a second package including an integrated device die.

18. The vertical mount package assembly of claim 17, the second package comprising a molding compound over the integrated device die.

19. The vertical mount package assembly of claim 17, the package comprising a molding compound over the at least one device.

20. The vertical mount package assembly of claim 17, the package comprising a cavity and a lid over the cavity, wherein the at least one device is disposed in the cavity.

21. The vertical mount package assembly of claim 17, wherein the at least one device is electrically connected to a first lead of the electrical leads by a first bonding wire, and wherein the integrated device die is electrically connected to the first lead by a second bonding wire.

* * * * *